(12) United States Patent
Lim (10) Patent No.: US 9,867,288 B2
(45) Date of Patent: Jan. 9, 2018

(54) SEMICONDUCTOR MEMORY CARD, PRINTED CIRCUIT BOARD FOR MEMORY CARD AND METHOD OF FABRICATING THE SAME

(71) Applicant: LG INNOTEK CO., LTD., Seoul (KR)

(72) Inventor: Seol Hee Lim, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 53 days.

(21) Appl. No.: 14/386,637

(22) PCT Filed: Mar. 20, 2013

(86) PCT No.: PCT/KR2013/002313
§ 371 (c)(1),
(2) Date: Sep. 19, 2014

(87) PCT Pub. No.: WO2013/141611
PCT Pub. Date: Sep. 26, 2013

(65) Prior Publication Data
US 2015/0016049 A1 Jan. 15, 2015

(30) Foreign Application Priority Data
Mar. 20, 2012 (KR) .................. 10-2012-0028199

(51) Int. Cl.
*H05K 1/05* (2006.01)
*H05K 1/11* (2006.01)
(Continued)

(52) U.S. Cl.
CPC ................. *H05K 1/05* (2013.01); *C25D 3/14* (2013.01); *C25D 3/16* (2013.01); *C25D 5/022* (2013.01);
(Continued)

(58) Field of Classification Search
CPC . C25D 3/14; C25D 3/16; C25D 5/022; C25D 5/12; H05K 1/05; H05K 3/244;
(Continued)

(56) References Cited

U.S. PATENT DOCUMENTS 3,953,304 A * 4/1976 Allan .................. C07D 213/20
205/275
4,600,609 A * 7/1986 Leever .................. C23C 18/34
106/1.22
(Continued)

FOREIGN PATENT DOCUMENTS

CN 101122044 A 2/2008
CN 101363817 B 9/2011
(Continued)

OTHER PUBLICATIONS

Partial European Search Report for European Patent Application No. 13764036 which corresponds to the above-identified U.S. application.
(Continued)

*Primary Examiner* — Ishwarbhai B Patel
(74) *Attorney, Agent, or Firm* — LRK Patent Law Firm (57) ABSTRACT

A printed circuit board for a memory card includes an insulating layer; a mounting part on a first surface of the insulating layer, the mounting part being electrically connected to a memory device; and a terminal part on a second surface of the insulating layer, the terminal part being electrically connected to an external electronic appliance, wherein a same metal layer having a same property is formed on exposed surfaces of the mounting part and the terminal part.

3 Claims, 8 Drawing Sheets

(51) Int. Cl.
*H05K 1/18* (2006.01)
*H05K 3/24* (2006.01)
*C25D 3/14* (2006.01)
*C25D 3/16* (2006.01)
*C25D 5/02* (2006.01)
*C25D 5/12* (2006.01)

(52) U.S. Cl.
CPC .............. *C25D 5/12* (2013.01); *H05K 1/181* (2013.01); *H05K 3/244* (2013.01); *H01L 2224/45144* (2013.01); *H01L 2224/48091* (2013.01); *H05K 1/11* (2013.01); *H05K 1/117* (2013.01); *H05K 2201/0104* (2013.01); *H05K 2201/032* (2013.01); *H05K 2201/0338* (2013.01); *H05K 2201/10159* (2013.01); *H05K 2203/049* (2013.01)

(58) Field of Classification Search
CPC .. H05K 1/11; H05K 1/117; H05K 2201/0338; H05K 2201/10159; H05K 2203/049; H05K 2201/0104; H05K 2201/032; H05K 1/111; H05K 1/18; H05K 1/181
USPC ................. 174/250–268; 361/760, 792–795; 257/777, 778, 784
See application file for complete search history.

(56) References Cited

U.S. PATENT DOCUMENTS

| | | | | |
|---|---|---|---|---|
| 4,628,165 | A * | 12/1986 | Nobel | C25D 3/567 200/268 |
| 6,800,121 | B2 * | 10/2004 | Shahin | C23C 18/36 106/1.22 |
| 8,127,979 | B1 | 3/2012 | Wu et al. | |
| 8,399,776 | B2 * | 3/2013 | Appelt | H01L 21/486 174/257 |
| 8,487,192 | B2 * | 7/2013 | Kunieda | H01L 21/6835 174/255 |
| 2002/0015782 | A1 * | 2/2002 | Abys | H05K 3/062 174/257 |
| 2002/0104682 | A1 * | 8/2002 | Park | H01L 23/49582 174/255 |
| 2005/0145971 | A1 * | 7/2005 | Okamura | H01L 29/1608 257/449 |
| 2007/0148971 | A1 | 6/2007 | Saha et al. | |
| 2007/0163255 | A1 * | 7/2007 | Rubel | F03G 7/06 60/527 |
| 2008/0042248 | A1 | 2/2008 | Nalla et al. | |
| 2008/0081455 | A1 | 4/2008 | Yu et al. | |
| 2008/0173995 | A1 * | 7/2008 | Kuratomi | H01L 21/566 257/679 |
| 2008/0224295 | A1 * | 9/2008 | Lien | H01L 23/13 257/686 |
| 2008/0316696 | A1 * | 12/2008 | Nishiyama | H01L 24/49 361/679.31 |
| 2009/0166858 | A1 | 7/2009 | Bchir et al. | |
| 2009/0294962 | A1 * | 12/2009 | Hsu | H01L 23/49816 257/738 |
| 2011/0201159 | A1 * | 8/2011 | Mori | H01L 21/4832 438/123 |
| 2011/0315984 | A1 * | 12/2011 | Suzuki | G06K 19/07732 257/48 |
| 2012/0175758 | A1 * | 7/2012 | Paek | H01L 23/49582 257/676 |
| 2014/0369016 | A1 | 12/2014 | Lim et al. | |

FOREIGN PATENT DOCUMENTS

| | | |
|---|---|---|
| JP | 2008050673 A | 3/2008 |
| KR | 10-2006-0006536 A | 1/2006 |
| KR | 10-2006-0109365 A | 10/2006 |
| KR | 10-2008-0030413 A | 4/2008 |
| KR | 10-2009-0073003 A | 7/2009 |
| KR | 10-2010-0011818 A | 2/2010 |
| KR | 20110057729 A | 6/2011 |
| KR | 10-2013-0013216 A | 2/2013 |
| TW | 200832575 A | 8/2008 |
| WO | 2013/094922 A1 | 6/2013 |

OTHER PUBLICATIONS

Search Report for International Application No. PCT/KR2013/002313.
SIPO Office Action for Chinese Application No. 201380026245.5 which corresponds to the above-referenced U.S. application.
TIPO Office Action for Taiwanese Application No. 102109883 which corresponds to the above-referenced U.S. application.

* cited by examiner

SEMICONDUCTOR MEMORY CARD, PRINTED CIRCUIT BOARD FOR MEMORY CARD AND METHOD OF FABRICATING THE SAME

TECHNICAL FIELD

Embodiments relate to a memory card, and more particularly, to a memory card in which the surface treatments for terminals and a mounting part can be simultaneously performed by using the same metal layer, a printed circuit board for the memory card and a method of fabricating the same.

BACKGROUND ART

Memory cards are used as storage devices for various electronic appliances such as a PDA, a digital camera or a camcorder.

Figure 1:
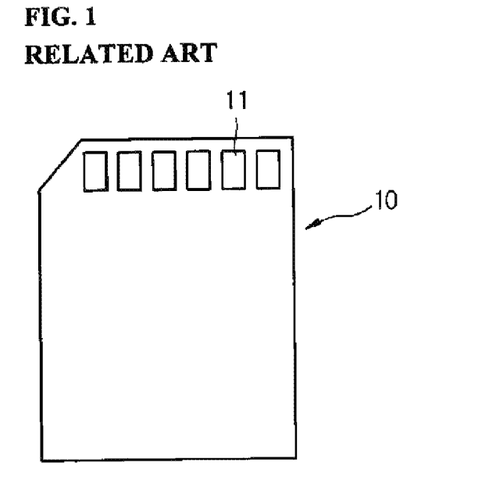
FIG. 1 is a view showing a memory card according to the related art.

FIG. 1 is a view showing one surface of a memory card according to the related art.

Referring to FIG. 1, in the memory card 10, a semiconductor device comprising a memory device is mounted on a printed circuit board for the memory card and the mounted semiconductor device is sealed with a resin molding part. In addition, a terminal part 11 is formed on, one surface of the memory card to sever as a connector for electrically connecting the memory card to an electronic appliance employing the memory card.

Meanwhile, since the terminal part 11 has the connector function with respect to the external electronic appliance, the product yield of the memory card 10 may be lowered if a defect, such as a scratch or an imprint, if formed on the terminal part 11.

FIGS. 2a to 2h are sectional views showing a process of fabricating a printed circuit board for a memory card according to the related art.

Figure 2A:
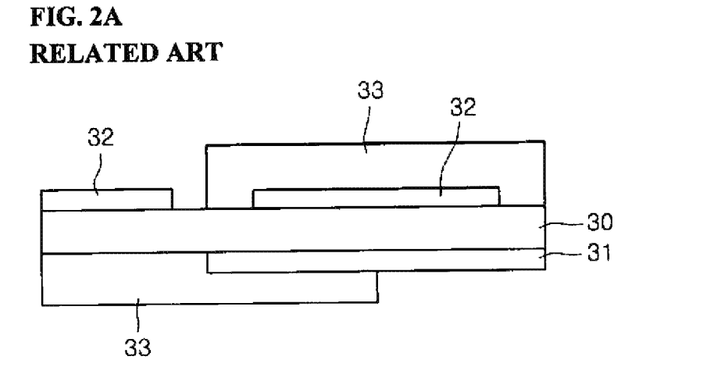
FIGS. 2a to 2h are sectional views illustrating a method of fabricating a memory card and a printed circuit board for a memory card according to the related art in the process sequence.

Referring to FIG. 2a, the printed circuit board for a memory card comprises a terminal part 31 formed on a bottom surface of an insulating layer 30 and a mounting part 32 on a top surface of the insulating layer 30. Although not shown, the terminal part 31 and the mounting part 32 may be electrically connected to each other through a via hole in which a conductive material is filled, so that a circuit may be formed.

The terminal part 31 provides a connector function of electrically connecting the mounting part 32 formed on the top surface of the insulating layer 30 to an external electronic appliance. The mounting part 32 forms a circuit or allows a resistor or a capacitor to be mounted thereon. In addition, the mounting part 32 provides a function of a metallic pad for electric connection with a memory device.

A PSR (Photo-imageable Solder Resist) 33 is formed on the top and bottom surfaces of the insulating layer 30 to expose portions of the terminal part 31 and the mounting part 32.

Figure 2B:
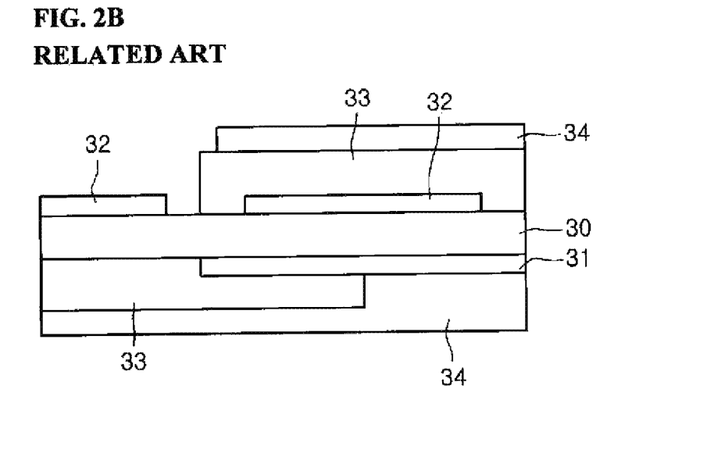

Referring to FIG. 2b, a first photosensitive dry film 34 is formed on and under the insulating layer 30, and the mounting part 32 for providing the function of the metallic pad is exposed through an exposure and development process.

Figure 2C:
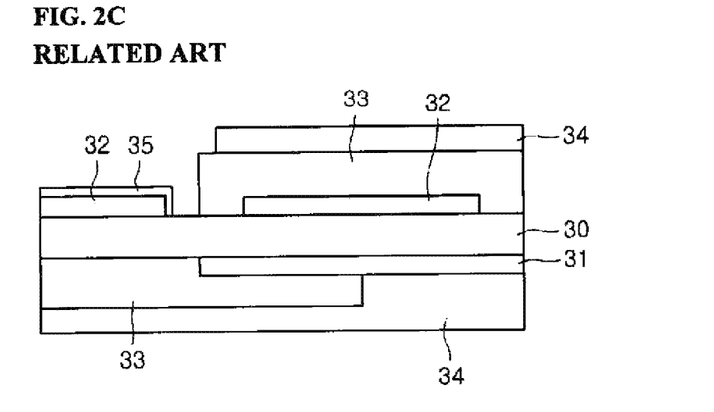

Referring to FIG. 2c, a soft gold layer 35 is plated on the mounting part 32 for providing the function of the metallic pad. The gold soft layer 35 can be subject to the gold wire bonding and may have a merit in soldering.

Figure 2D:
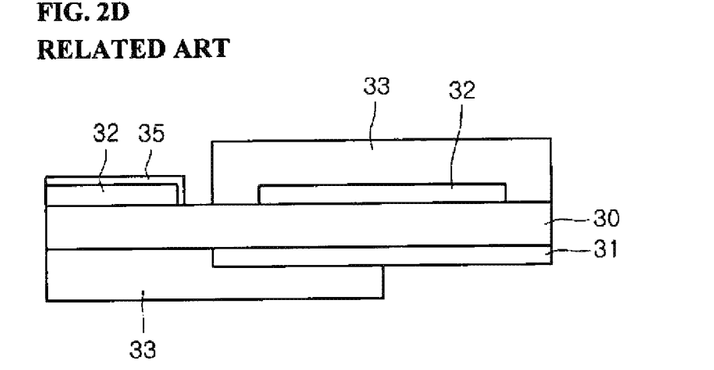

As shown in FIG. 2d, the first photosensitive dry film 34 is removed.

Figure 2E:
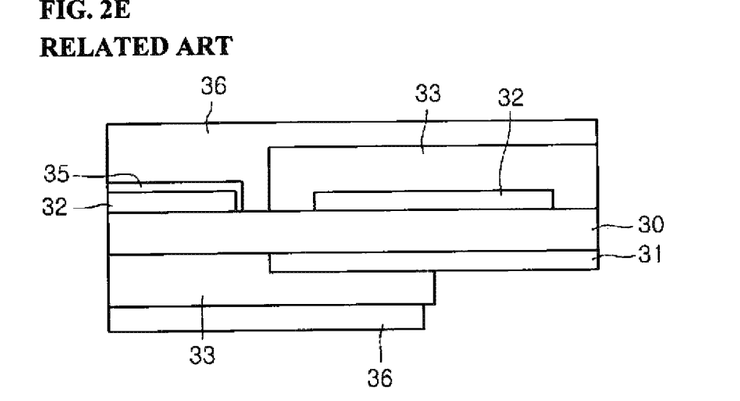

Referring to FIG. 2e, a second photosensitive dry film 36 is formed on and under the insulating layer 30 and the terminal part 31 which provides the connector function is exposed through an exposure and development process.

Figure 2F:
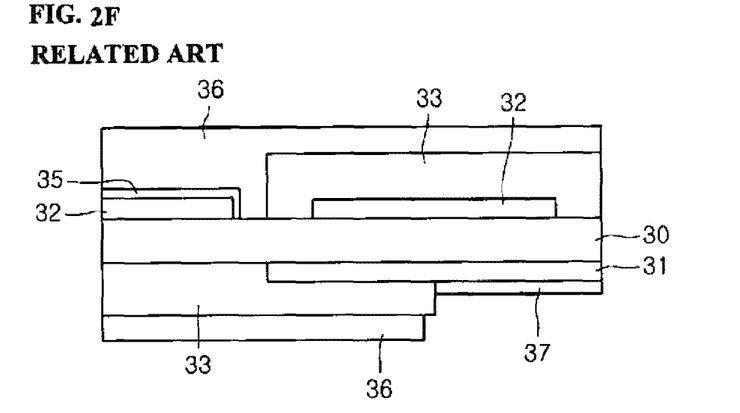

Referring to FIG. 2f, a hard gold layer 37 is plated on the terminal part 31 having the connector function.

Since the hard gold layer 37 has a high surface strength and high resistance against corrosion, the hard gold layer 37 is plated on a portion frequently coupled/decoupled with an electronic appliance, such as a connector of a memory card electronic appliance.

Figure 2G:
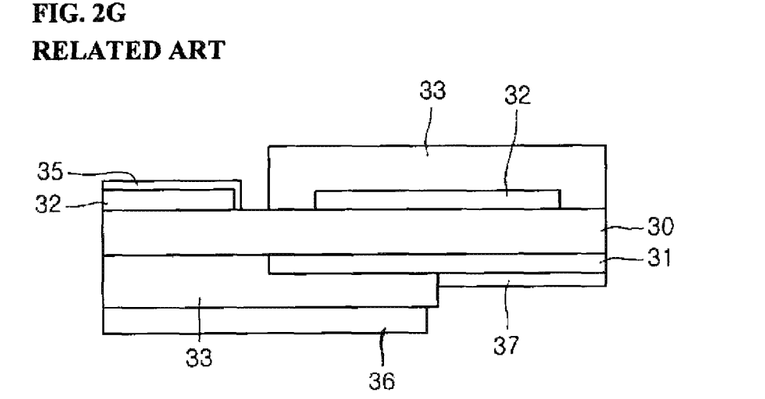

Referring to FIG. 2g, the second photosensitive dry film 36 is removed. Before the second photosensitive dry film 36 is removed, in order to prevent the hard gold layer 37 from being damaged, a protective layer (not shown) may be additionally formed.

When the process described above is performed, the printed circuit board for a memory card may be fabricated. After the printed circuit board is fabricated, a memory semiconductor chip and a memory controller are attached to the printed circuit board to form the memory card.

Figure 2H:
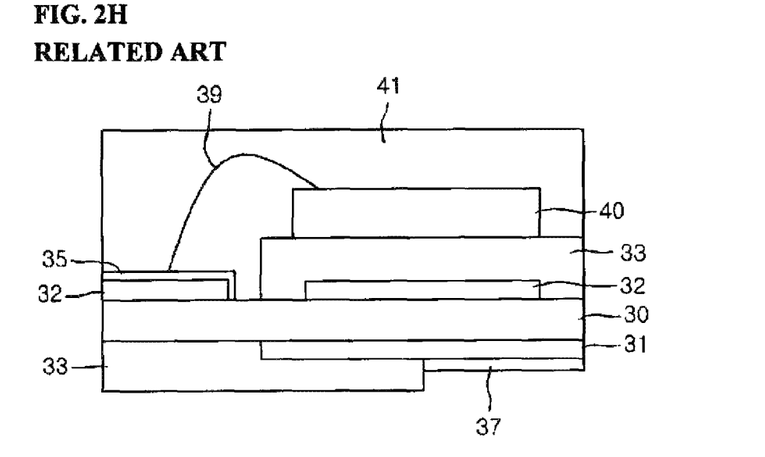

That is, as shown in FIG. 2h, a memory device 40 is mounted on the photo-imageable solder resist 33 formed over the insulating layer 30 and the memory device 40 is electrically connected to the soft gold layer 35 through a wire 39. For example, the memory device 40 may include a memory chip and a memory controller.

In addition, a molding member 41 is formed to the top side of the insulating layer 30 comprising the memory device 40 and the soft gold layer 35. The molding member 41 is formed by using an epoxy molding material called EMC (Epoxy Molding Compound), so that the molding member 41 protects circuit components comprising the memory device 40 from an external shock or environment.

DISCLOSURE OF INVENTION

Technical Problem

According to a process of fabricating a printed circuit board for a memory substrate according to the related art described above, since a property required to the additional terminal part 31 is different from that required to the mounting part 32, mutually different gold plating steps must be performed for the terminal part 31 and the mounting part 32. Thus, a plurality of processes, such an exposure and development process and a delamination process of a dry film, are required, exerting a bad influence in terms of economy and productivity.

Solution to Problem

According to an embodiment, there is provided a printed circuit board for a memory substrate having a novel structure and a method of fabricating the same.

Further, according to an embodiment, there is provided a memory substrate having a novel structure.

In addition, according to an embodiment, there are provided a novel surface treatment method which can simultaneously endow material properties required in a mounting part and a terminal part of a printed circuit board for a memory substrate, and a printed circuit board for a memory substrate fabricated through the above method.

The technical objects to be accomplished in suggested embodiments are not limited to the technical objects, and other objects can be clearly comprehended from the following description by those skilled in the art.

According to one embodiment, there is provided a printed circuit board for a memory card. The printed circuit board comprises an insulating layer; a mounting part on a first surface of the insulating layer, the mounting part being electrically connected to a memory device; and a terminal part on a second surface of the insulating layer, the terminal part being electrically connected to an external electronic appliance, wherein a same metal layer having a same property is formed on exposed surfaces of the mounting part and the terminal part.

Further, according to one embodiment, there is provided a memory card comprising a printed circuit board comprising an insulating layer; a memory device mounted on a predetermined region of a first surface of the printed circuit board; a first pattern electrically connected to the memory device; and a second pattern formed on a second surface of the printed circuit board and electrically connected to an external electronic appliance, wherein a same metal layer having a same property is formed on exposed surfaces of the first and second patterns, respectively.

In addition, according to one embodiment, there is provided a method of fabricating a printed circuit board for a memory card. The method comprises preparing an insulating layer formed on first and second surfaces thereof with metal thin films; forming a mounting part on the first surface of the insulating layer and a terminal part on the second surface of the insulating layer by selectively removing the metal thin films formed on the first and second surfaces of the insulating layer; selectively forming a photo-imageable solder resist on the first and second surfaces of the insulating layer in order to expose surfaces corresponding to the exposed mounting part and the exposed terminal part; and performing a surface treatment by plating surfaces of the exposed mounting and terminal parts with a same metal material having a same property.

Advantageous Effects of Invention

According to the embodiments, the surface treatment method which can satisfy soldering, wire bonding and wear resistance properties can be provided.

Thus, the surface treatment method, which can satisfy the hardness and the wire bonding property while reducing the thickness of the gold plating layer, can be provided. When the thickness of the gold plating layer is reduced, the plating layer, which satisfies the hardness and the wire bonding property while reducing the gold thickness required to the surface treatment, can be ensured. Therefore, the surface treatment method according to the embodiment can be applied not only to general printed circuit board products, but also to various boards.

Further, when the surface treatment method according to the embodiment is applied to the field of the memory card, the plating processes for the terminal and mounting parts can be simultaneously performed at once without separately performing the processes, so that the process of fabricating a printed circuit board can be simplified and the process cost can be reduced. In addition, the material cost can be reduced due to the reduction of the gold thickness.

In addition, according to the embodiment, the ratio of the primary brightener to the secondary brightener can be optimally adjusted, so that an abnormal plating phenomenon, that is, the abnormal spreading of nickel can be prevented when plating the nickel.

MODE FOR THE INVENTION

Embodiments will be described in detail with reference to accompanying drawings so that those skilled in the art can easily work with the embodiments. However, the embodiments may not be, limited to those described below, but have various modifications.

In the following description, when a predetermined part comprises a predetermined component, the predetermined part does not exclude other components, but may further include other components unless otherwise indicated.

The thickness and size of each layer shown in the drawings may be exaggerated, omitted or schematically drawn for the purpose of convenience or clarity. In addition, the size of elements does not utterly reflect an actual size. The same reference numbers will be assigned the same elements throughout the drawings.

In the description of the embodiments, it will be understood that when a layer, a film, a region, or a plate is referred to as being on another layer, another film, another region, or another plate, it can be directly or indirectly on the other layer, other film, other region, other plate, or one or more intervening layers may also be present. In contrast, when a part is referred to as being directly on another part, the intervening layer is not present.

The embodiment provides a memory card, a printed circuit board for a memory card and a method of fabricating the same comprising a nickel metal layer formed of a nickel plating solution into which a primary brightener and a secondary brightener are added. The primary brightener comprising at least one of naphthalene, saccharine, sulfonic acid soda and sulfonamide, and the secondary brightener comprising at least one of butynediol, coumarine and udelight.

Figure 3:
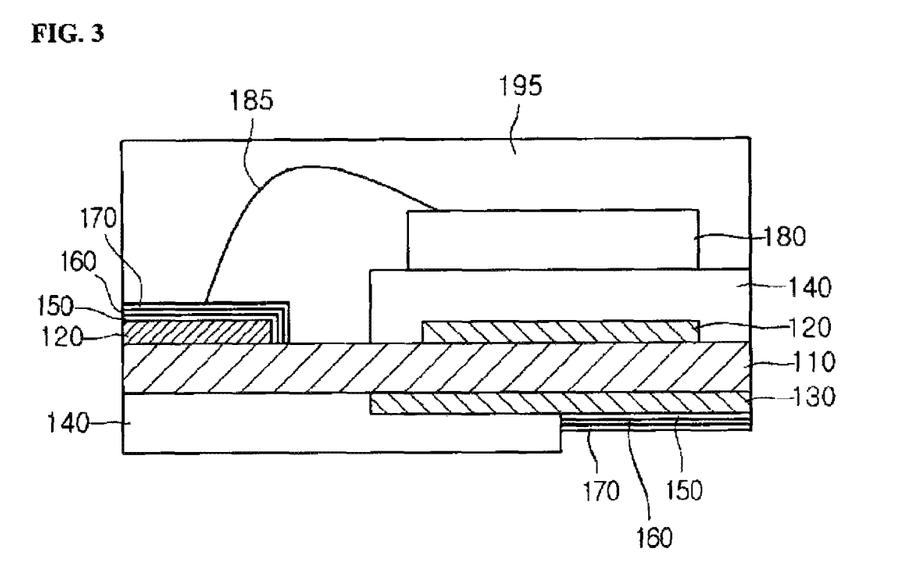
FIG. 3 is a view showing a memory card and a printed circuit board for a memory card according to an embodiment.

Referring to FIG. 3, the memory card and the printed circuit board 100 for a memory card according to the embodiment comprises an insulating layer 110, a mounting part 120 formed on a top surface of the insulating layer 110, a terminal part 130 formed on a bottom surface of the insulating layer 110, a protective layer (not illustrated) formed on the insulating layer 110, a nickel metal layer 150 formed on exposed portions of the mounting part 120 and the terminal part 130, a palladium metal layer 160 formed on the nickel metal layer 150, and a gold metal layer 170 formed on the palladium metal layer 160.

The insulating layer 110 may be a support substrate of the printed circuit board on which a single circuit pattern is formed, but the insulating layer 110 may mean an insulating layer region, in which one circuit pattern (not shown) is formed, in a printed circuit board having a structure of a plurality of laminated layers.

The insulating layer 110 may include a thermoset polymer substrate, a thermoplastic polymer substrate, a ceramic substrate, an organic-inorganic hybrid substrate, or an impregnated fiberglass substrate. If the carrier substrate C comprises polymer resin, the carrier substrate C may include epoxy insulating resin. In addition, the insulating layer 110 may include polyimide resin.

The mounting part 120 is formed on the top surface of the insulating layer 110, and the terminal part 130 is formed on the bottom surface of the insulating layer 110.

Although the mounting and terminal parts 120 and 130 are depicted as to be formed on the top and bottom surfaces of the insulating layer 110, this is illustrative purpose only and both of the mounting and terminal parts 120 and 130 may be formed on one surface of the insulating layer 110.

For example, the mounting and terminal parts 120 and 130 may be formed on only one of the top and bottom surfaces of the insulating layer 110 or on all of both surfaces of the insulating layer 110. Further, similar with the mounting part 120, the terminal part 130 may be formed on only one of the top and bottom surfaces of the insulating layer 110 or on all of both surfaces of the insulating layer 110.

The mounting and terminal parts 120 and 130 may be formed of a conductive material, and may be formed by selectively removing metal thin films disposed on the top and bottom surfaces of the insulating layer 110.

Thus, the mounting and terminal parts 120 and 130 may be formed of an alloy comprising copper and roughness may be formed on the surfaces.

The mounting part 120 is formed for mounting components, and the terminal part 130 is formed for electrically connecting with an external electronic appliance.

That is, the terminal part 130 provides a connector function of electrically connecting the mounting part 120 formed on the top surface of the insulating layer 110 to an external electronic appliance, and the mounting part 120 provides a metal pad function of configuring a circuit, mounting a resistor and a capacitor, or electrically connecting with a memory device.

A PSR (Photo-imageable solder resist) 140 is formed over or below the insulating layer 110 such that portions of the mounting and terminal parts 120 and 130 are exposed.

The photo-imageable solder resist 140 is partially coated on the bottom surface of the insulating layer 110 and the terminal part 130 as well as on the top surface of the insulating layer 110 and the mounting part 120 constituting a circuit. The photo-imageable solder resist 140 may not be coated on the mounting part 120 which provides the metal pad function.

The same metal layer is formed on the mounting and terminal part 120 and 130.

The properties required to the surfaces of the mounting and terminal parts 120 and 130 are different from each other.

The mounting part 120 must have a wire bonding property of a predetermined level or more, and the terminal part 130 must satisfy a hardness of a predetermined level or more. That is, since the terminal part 130 is exposed to an outside, the terminal part 130 must have a glossiness of a predetermined level or more and sufficient wear resistance.

As shown in FIGS. 2a to 2h, in the related art, the surface treatment of the mounting part 120 has been different from that of the terminal part 130.

However, according to the embodiment, the same surface treatment is applied to the exposed mounting and terminal parts 120 and 130 to satisfy the wire bonding property which the mounting part 120 must have, and the glossiness and the wear resistance which the terminal part 130 must have. Thus, different from the related art in which a plurality of plating processes are performed on the top and bottom surfaces of the insulating layer 110, the embodiment can form the same layer on the top and bottom surfaces of the insulating layer 110 at once.

To this end, a nickel metal layer 150 is formed on the exposed mounting and terminal parts 120 and 130.

The nickel metal layer 150 is formed by using a nickel plating solution comprising nickel (Ni) and roughness is formed on a surface thereof.

The nickel metal layer 150 may be formed of only nickel or a nickel alloy comprising nickel and P, B, W or Co. The nickel metal layer 150 may have a thickness in the range of 2 μm to 10 μm, preferably, 5 μm to 8 μm.

At least one brightener is added into the nickel plating solution used for forming the nickel metal layer 150. The brightener is added into the nickel plating liquid in order to control the glossiness of the nickel metal layer 150.

The brightener comprises a primary brightener and a secondary brightener. The primary brightener comprises at least one of naphthalene, saccharine, sulfonic acid soda and sulfonamide, and the secondary brightener comprises at least one of butynediol, coumarin and udelight. Since the glossiness is inversely proportion to the roughness, the glossiness may be changed by controlling the roughness.

The primary brightener is added into the nickel plating solution at a concentration in the range of 5 Ml/l to 7 Ml/l, and the second brightener is added into at a concentration in the range of 0.2 Ml/l to 0.4 Ml/l. The primary and secondary brighteners exert an influence on the wear resistance and the glossiness of the nickel metal layer 150.

The primary and secondary brighteners are all added into the nickel plating solution in order to obtain the glossiness of 1.8 or more. If the concentration of the primary brightener is increased, the glossiness is increased so that the wear resistance is improved due to the thin wear thickness. Further, if the concentration of the secondary brightener is increased, the glossiness is little influenced so that the wear resistance is not largely influenced.

When the concentrations of the primary and secondary brighteners are increased in the range of satisfying the glossiness, it is difficult to manage the plating solution. Since the increases of the concentrations of the primary and secondary brighteners exert an influence on the glossiness and the wear resistance, the primary brightener is added at a concentration in the range of 5 Ml/l to 7 Ml/l and the secondary brightener is added at a concentration in the range of 0.2 Ml/l to 0.4 Ml/l by taking the liquid stability into consideration Meanwhile, the ratio of the primary brightener to the secondary brightener exerts an influence on the first thickness of the plating layer which is formed on the top surface of the under layer and the second thickness of the plating layer which is formed on the side surface of the under layer.

When the difference between the first and second thicknesses deviates from a predetermined value, the reliability of the printed circuit board may be lowered.

Thus, according to the embodiment, the ratio of the primary brightener to the secondary brightener is set to 20:1 for maintaining the ratio of the plating thicknesses defined as first thickness/second thickness at 1.07.

The nickel metal layer 150 having the first and second thickness substantially equal to each other may be obtained by forming the nickel metal layer 150 by using the nickel plating solution into which the primary and secondary brighteners are added at the ratio describe above.

A palladium metal layer 160 is formed on the nickel metal layer 150.

The palladium metal layer 160 is formed by using a palladium plating solution and roughness may be formed on a surface thereof.

The palladium plating solution for the palladium metal layer 160 may include only palladium. Alternatively, the palladium plating solution may further include at least one of Co, Zn, Ni and an inorganic material.

The palladium metal layer 160 is formed to ensure a predetermined hardness or more.

Preferably, the palladium metal layer 160 is formed of an alloy of palladium and nickel. The thickness of the palladium metal layer 160 has a thickness in the range of 0.05 μm to 0.5 μm or preferably, 0.1 μm to 0.2 μm.

A gold metal layer 170 is formed on the palladium metal layer 160.

The gold metal layer 170 is formed through a gold plating scheme, and an inorganic crystal agent and an organic additive may be added into the gold plating solution in order to enhance the hardness and control the roughness.

The gold plating solution is provided for the purpose of satisfying the solder bonding property, the wire bonding property and the hardness of a predetermined level or more. The concentration of the inorganic crystal agent and the organic additive, which are added into the gold plating solution, is controlled, such that the hardness required to the gold metal layer 170 may be satisfied.

The additive added to the gold plating solution determines the crystal structure of the plating layer. The inorganic crystal agent exerts an influence on the crystal structure of the plating layer.

Preferably, the inorganic crystal agent is added into the gold plating solution at the concentration in the range of 1.5 Ml/l to 2 Ml/l. As the inorganic crystal agent is added in the above range, the structure is densely configured as compared with the structure where the concentration is 1 Ml/l, so that the hardness required to the gold metal layer 170 may be satisfied.

When an additional additive is added to the gold plating solution in order to change the roughness, the grain becomes fine due to the additional additive, so that the gold metal layer tends to be an amorphous configuration. Thus, it is preferable that the additional additive, for example, the brightener is not added to the gold plating solution.

As the plating temperature for forming the gold metal layer 170 is lowered, the hardness is more hardened. Specifically, since the optimal hardness characteristic is satisfied at the temperature in the range of 30° C. to 40° C., it is preferable to form the gold metal layer 170 described above at the plating temperature in the range of 30° C. to 40° C.

Further, the gold metal layer 170 formed of the gold plating solution described above has a thickness in the range of 0.05 μm to 0.5 μm. Preferably, the gold metal layer 170 has a thickness in the range of 0.1 μm to 0.2 μm.

As describe above, the hardness of the metal pattern comprising the nickel metal layer 150, the palladium metal layer 160 and the gold metal layer 170 is increased through a component variation of the gold plating solution, so the properties of solder wettability, wire bonding and wear resistance may be ensured.

Preferably, the plating solutions for forming the metal layers are acidic or neutral type in order to prevent the damage of the plating solution and the substrate due to elution of the photo-imageable solder resist and the dry film.

The printed circuit board for a memory card described above may provide a surface treatment method, which can satisfy the hardness and the wire bonding property while the thickness of the gold plating layer is reduced.

Further, when the plating layers described above are applied to the memory card field, the plating processes for the terminal and mounting parts can be simultaneously performed at once without separately performing the processes, so that the process of fabricating a printed circuit board can be simplified, so the process cost can be reduced. In addition, the material cost can be reduced due to the reduction of the gold thickness.

Hereinafter, a method of fabricating a memory substrate of FIG. 3 and a printed circuit board for a memory substrate will be described with reference to FIGS. 4 to 11.

Figure 4:
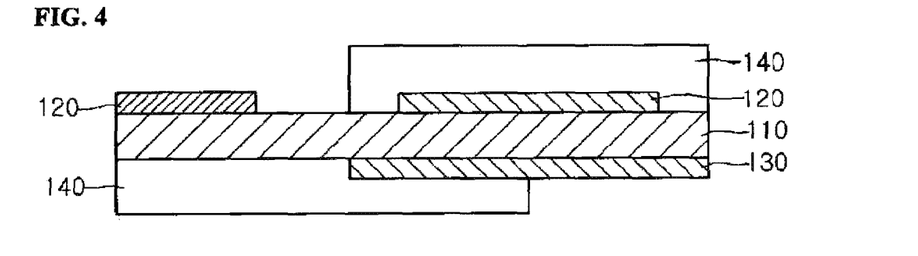
FIGS. 4 to 11 are views illustrating a method of fabricating a memory card and a printed circuit board for a memory card according to an embodiment in the process sequence.

First, referring to FIG. 4, the mounting part 120 is formed on the top surface of the insulating layer 110 and the terminal part 130 is formed on the bottom surface of the insulating layer 110. Although not shown, the mounting and terminal parts 120 and 130 are electrically connected to each other through a via hole in which a conductive material is filled, so that a circuit may be configured.

The insulating layer 110 may be formed of a material of electric insulation. The mounting and terminal parts 120 and 130 may be formed by selectively removing metal thin films disposed on the top and bottom surfaces of the insulating layer 110.

To this end, the insulating layer 110 is prepared and a conductive layer (not shown) is laminated on the insulating layer 110. The laminated structure of the insulating layer 110 and the conductive layer may constitute a typical CCL (Copper Clad Laminate). The conductive layer may be formed on the insulating layer 110 through an electroless plating scheme. When the conductive layer is formed through the electroless plating scheme, roughness is provided on the top surface of the insulating layer 110, so that the plating may be smoothly performed.

The terminal part 130, which is formed on the bottom surface of the insulating layer 110, provides a connector function of electrically connecting the mounting part 120 formed on the top surface of the insulating layer 110 to an external electronic appliance. The mounting part 120 forms a circuit, allows a resistor or a capacitor to be mounted thereon, or provides a function of a metallic pad for electrically connecting with a memory device.

Then, a PSR (photo-imageable solder resist) 140 is formed over or below the insulating layer 110 such that portions of the mounting and terminal parts 120 and 130 are exposed.

The photo-imageable solder resist 140 is partially coated on the terminal part 130 and the bottom surface of the insulating layer 110 as well as on the top surface of the insulating layer 110 and the mounting part 120 constituting a circuit. The photo-imageable solder resist 140 may not be coated on the mounting part 120 which provides the metal pad function.

Figure 5:
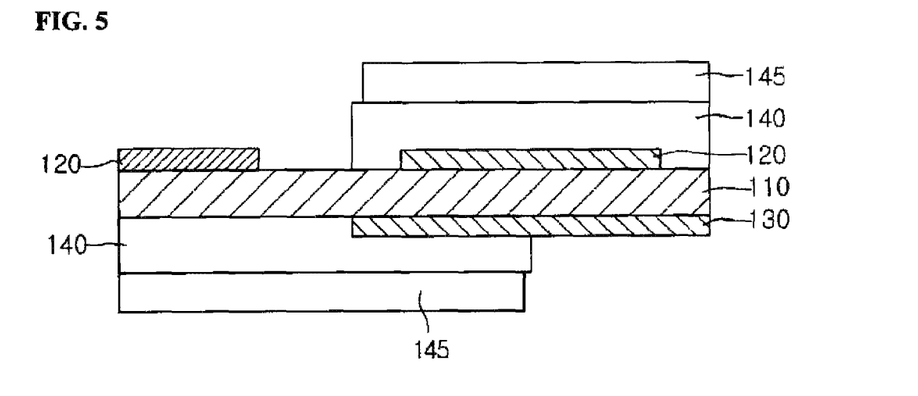

Referring to FIG. 5, a photosensitive dry film 145 is formed on upper and lower sides of the insulating layer 110, and then, the mounting part 120 which provides the connector function and the surface of the terminal part 130, which provides the function of connecting with an external appliance, are exposed through an exposure and development process.

That is, the photosensitive dry film 145 is formed on the top and bottom surfaces of the insulating layer 110, and is formed to expose portions of the mounting and terminal parts 120 and 130.

Figure 6:
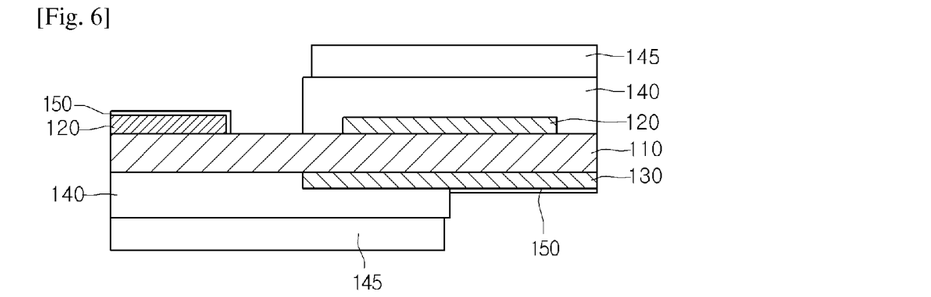

Referring to FIG. 6, a nickel metal layer 150 is formed on the exposed mounting part 120 which provides the metal pad function and the exposed terminal part 130.

The nickel metal layer 150 is formed on the exposed mounting and terminal parts 120 and 130 through a plating scheme using a nickel plating solution.

Preferably, the roughness is formed on the surfaces of the exposed mounting and terminal parts 120 and 130, so that the nickel metal layer 150 may be easily formed.

The nickel metal layer 150 may be formed of only nickel or a nickel alloy comprising nickel and P, B, W or Co. The nickel metal layer 150 may have a thickness in the range of 2 μm to 10 μm, preferably, 5 μm to 8 μm.

At least one brightener is added into the nickel plating solution used for forming the nickel metal layer 150. The brightener is added into the nickel plating liquid in order to control the glossiness of the nickel metal layer 150.

The brightener comprises a primary brightener and a secondary brightener. The primary brightener comprises at least one of naphthalene, saccharine, sulfonic acid soda and sulfonamide, and the secondary brightener comprises at least one of butynediol, coumarine and udelight. Since the glossiness is inversely proportion to the roughness, the glossiness may be changed by controlling the roughness.

The primary brightener is added into the nickel plating solution at a concentration in the range of 5 Ml/l to 7 Ml/l, and the second brightener is added into at a concentration in the range of 0.2 Ml/l to 0.4 Ml/l. The primary and secondary brighteners exert an influence on the wear resistance and the glossiness of the nickel metal layer 150.

The primary and secondary brighteners are all added into the nickel plating solution in order to obtain the glossiness of 1.8 or more. If the concentration of the primary brightener is increased, the glossiness is increased so that the wear resistance is improved due to the thin wear thickness. Further, if the concentration of the secondary brightener is increased, the glossiness is little influenced so that the wear resistance is not largely influenced.

When the concentrations of the primary and secondary brighteners are increased in the range of satisfying the glossiness, it is difficult to manage the plating solution. Since the increases of the concentrations of the primary and secondary brighteners exert an influence on the glossiness and the wear resistance, the primary brightener is added at a concentration in the range of 5 Ml/l to 7 Ml/l and the secondary brightener is added at a concentration in the range of 0.2 Ml/l to 0.4 Ml/l by taking the liquid stability into consideration.

The ratio of the primary brightener to the secondary brightener exerts an influence on the first thickness of the plating layer which is formed on the top surface of the under layer and the second thickness of the plating layer which is formed on the side surface of the under layer.

When the difference between the first and second thicknesses deviates from a predetermined value, the reliability of the printed circuit board may be lowered.

Thus, according to the embodiment, the ratio of the primary brightener to the secondary brightener is set to 20:1 for maintaining the ratio of the plating thicknesses defined as first thickness/second thickness at 1.07

The nickel metal layer 150 having the first and second thickness substantially equal to each other may be obtained by forming the nickel metal layer 150 by using the nickel plating solution into which the primary and secondary brighteners are added at the ratio describe above.

Figure 7:
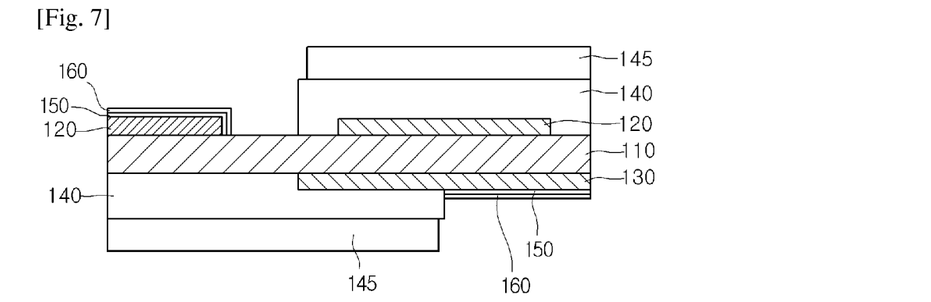

Next, referring to FIG. 7, a palladium metal layer 160 is formed on the nickel metal layer 150.

The palladium plating solution for the palladium metal layer 160 may include only palladium. Alternatively, the palladium plating solution may further include at least one of Co, Zn, Ni and an inorganic material.

The palladium metal layer 160 is formed to ensure a predetermined hardness or more.

Preferably, the palladium metal layer 160 is formed of an alloy of palladium and nickel. The thickness of the palladium metal layer 160 has a thickness in the range of 0.05 μm to 0.5 μm or preferably, 0.1 μm to 0.2 μm.

Figure 8:
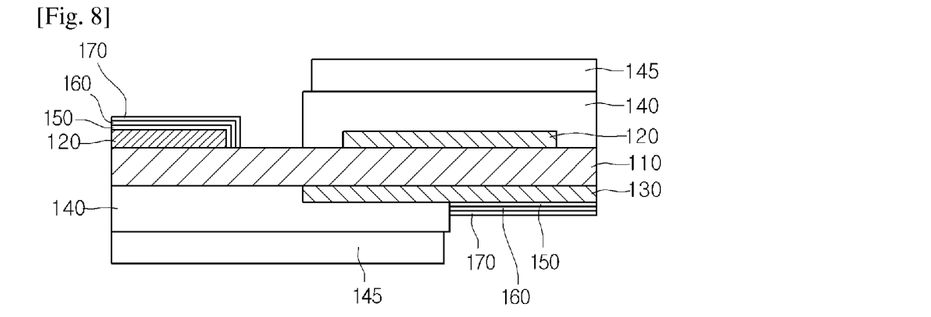

Next, referring to FIG. 8, a gold metal layer 170 is formed on the palladium metal layer 160.

The gold metal layer 170 is formed through a gold plating scheme, and an inorganic crystal agent and an organic additive is added into the gold plating solution in order to enhance the hardness and control the roughness.

The gold plating solution is provided for the purpose of satisfying the solder bonding property, the wire bonding property and the hardness of a predetermined level or more. The concentration of the inorganic crystal agent and the organic additive, which are added into the gold plating solution, is controlled, such that the hardness required to the gold metal layer 170 may be satisfied.

The additive added into the gold plating solution determines the crystal structure of the plating layer. The inorganic crystal agent exerts an influence on the crystal structure of the plating layer.

Preferably, the inorganic crystal agent is added into the gold plating solution at the concentration in the range of 1.5 Ml/l to 2 Ml/l. As the inorganic crystal agent is added in the above range, the structure is densely configured as compared with the structure where the concentration is 1 Ml/l, so that the hardness required to the gold metal layer 170 may be satisfied.

When an additional additive is added to the gold plating solution in order to change the roughness, the grain becomes fine due to the additional additive, so that the gold metal layer tends to be an amorphous configuration. Thus, it is preferable that the additional additive, for example, the brightener is not added to the gold plating solution.

As the plating temperature for forming the gold metal layer 170 is lowered, the hardness is more hardened. Specifically, since the optimal hardness characteristic is satisfied at the temperature in the range of 30° C. to 40° C., it is preferable to form the gold metal layer 170 described above at the plating temperature in the range of 30° C. to 40° C.

Further, the gold metal layer 170 formed of the gold plating solution described above has a thickness in the range of 0.05 μm to 0.5 μm. Preferably, the gold metal layer 170 has a thickness in the range of 0.1 μm to 0.2 μm.

As describe above, the hardness of the metal pattern comprising the nickel metal layer 150, the palladium metal layer 160 and the gold metal layer 170 is increased through a component variation of the gold plating solution, so the properties of solder wettability, wire bonding and wear resistance may be ensured.

Figure 9:
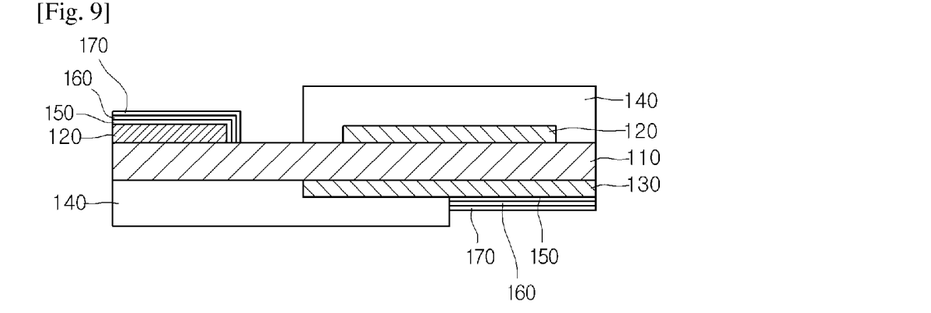

As shown in FIG. 9, the first photosensitive dry film 145 is removed.

Figure 10:
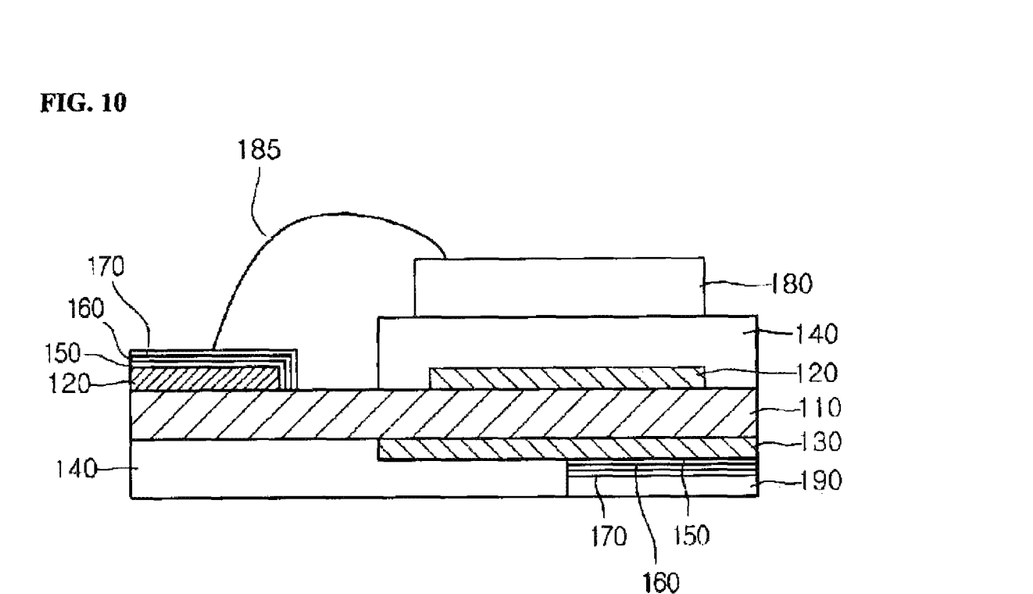

Then, as shown in FIGS. 3 and 10, a memory device 180 is attached and preferably, the memory device is electrically connected to the gold metal layer 170 formed on the mounting part 120 through a wire 185.

During the process of mounting the memory device 180, since a defect such as a scratch or an imprint may be created on the gold metal layer 170, a protective layer 190 is formed on the gold metal layer 170 formed on the terminal part 130 in order to prevent the gold metal layer 170 from being damaged.

The protective layer 190 may be formed through an electro-plating scheme or an electro-deposition scheme.

The protective layer 190 may be formed of metal or nonmetal. For example, when the protective layer 190 is formed through the electro-plating scheme, the protective layer 190 may be formed of one of Cu, Pb, Sn and Ni. For example, when the protective layer is formed through the electro-deposition scheme, the protective layer 190 may formed of a resist layer.

Preferably, the protective layer 190 is formed before the photosensitive dry film 145 is removed.

If the protective layer 190 is formed, the memory device 180 is mounted on the photo-imageable solder resist 140 at a top side of the insulating layer 110. Then, the memory device 180 is electrically connected to the gold metal layer 170 formed on the mounting part 120. For example, the memory device 180 may include a memory semiconductor chip and a memory controller.

Although not depicted in detail, a passive element such as a resistor or a capacitor may be mounted on the gold metal layer 170 of the mounting part 120.

Figure 11:
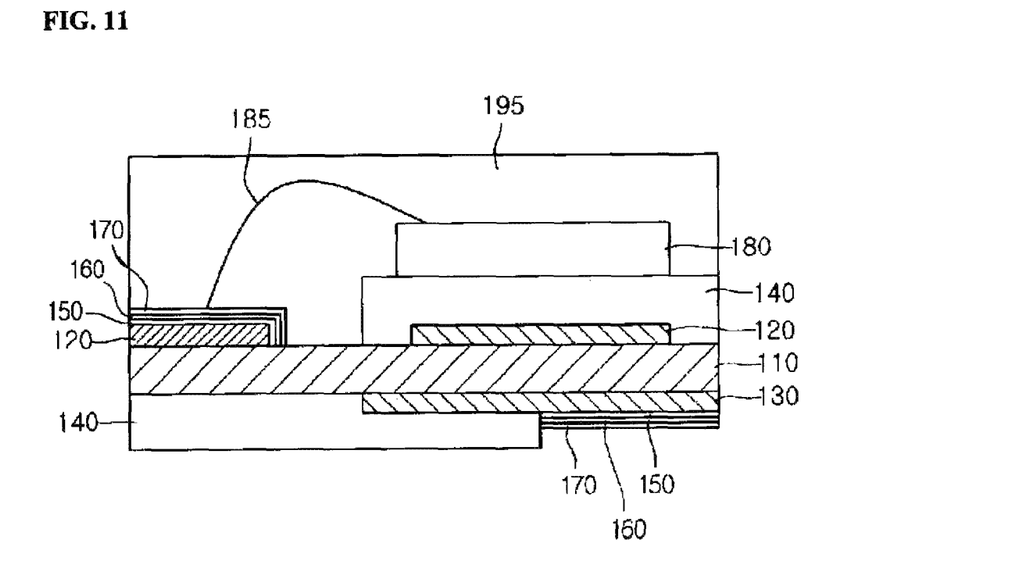

Then, referring to FIG. 11, a molding member 195 is formed at the top side of the insulating layer 110 comprising the memory device 180 and the gold metal layer 170 of the mounting part 120. The molding member 195 is formed by an epoxy molding material called EMC (Epoxy Molding Compound), so that the molding member 195 protects circuit components comprising the memory device 180 from an external shock or environment.

As described above, when the main processes for fabricating, a memory card are completed, the protective layer 190 is removed. The protective layer 190 may be removed by using an exclusive exfoliation agent according to a used material thereof, such that the gold metal layer 170 formed on the terminal part 130 is not damaged. For example, when the protective layer 130 is formed of copper, the copper may be removed through an alkaline etching process.

Figure 12:
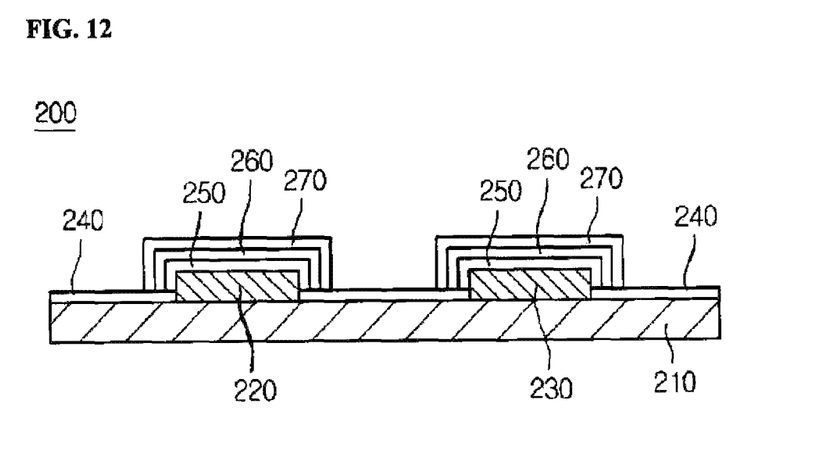
FIG. 12 is a view showing a printed circuit board for a memory card according to another embodiment.

FIG. 12 is a view showing a printed circuit board for a memory card according to another embodiment.

Referring to FIG. 12, the printed circuit board 200 for a memory card comprises an insulating layer 210, a mounting part 220 formed on a top surface of the insulating layer, a terminal part 230 formed on the top surface of the insulating layer, a photo-imageable solder resist 240 formed on the insulating layer 210 and exposing the mounting part 220 and the terminal part 230, a nickel metal layer 250 formed on each of the exposed mounting part 220 and the exposed terminal part 230, a palladium metal layer 260, and a gold metal layer 270.

That is, elements and the method of FIG. 12 are substantially the same as the memory card, the printed circuit board for a memory card and the method of fabricating the same depicted in FIGS. 3 to 11 except that the terminal part 230 is formed on the top surface of the insulating layer 210 rather than the bottom surface of the insulating layer 210.

In other words, the printed circuit board depicted in FIG. 12 is a general printed circuit board, and the features of the printed circuit board for a memory card and the method of fabricating the same shown in FIGS. 3 to 11 may be applied to the general printed circuit board.

That is, the nickel metal layer, the palladium metal layer and the gold metal layer 150, 160, 170, 250, 260 and 270 have the wire bonding property of a predetermined level, the gloss property of a predetermined level and a wear resistance property of a predetermined level, the layers may be formed on wires requiring mutually different features.

In other words, the nickel metal layer, the palladium metal layer and the gold metal layer 150, 160, 170, 250, 260 and 270 may be formed on wires requiring a wire bonding property. To the contrary, the layers may be formed on wires requiring glossiness and wear resistance properties according to hardnesses.

Meanwhile, different from the description above, the memory substrate and the printed circuit board may include only two metal layers.

That is, although the metal layers comprising the nickel metal layer, the palladium metal layer and the gold metal layer are described above, the metal layer may include only the nickel metal layer and the gold metal layer.

Figure 13A:
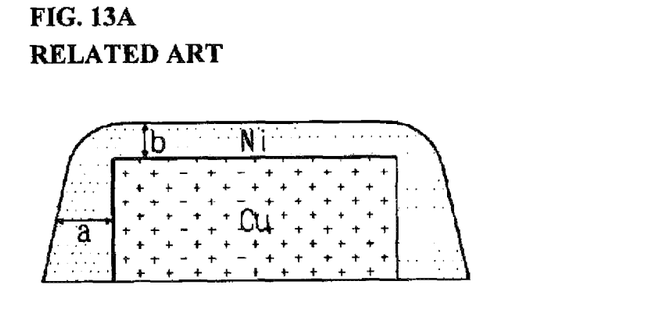
FIGS. 13A and 13B are views showing a metal layer of a printed circuit board according to the related art.
Figure 13B:
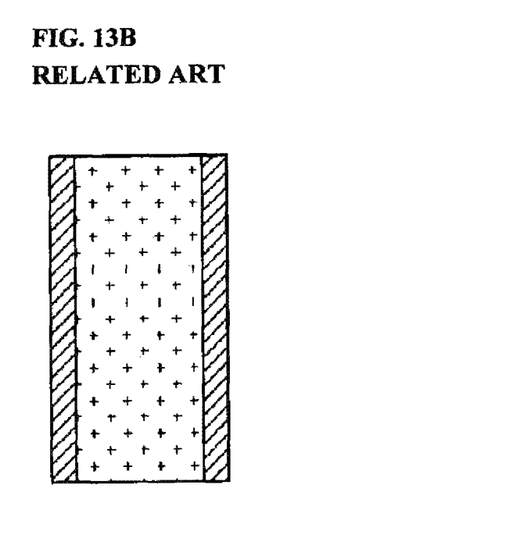

FIG. 13A and 13B are views showing a metal layer of a printed circuit board according to the related art.

As shown in FIGS. 13A and 13B, when a nickel metal layer is formed according to the related art, the brightener restrains the plating on an upper portion of a circuit pattern, so that a plating thickness of the nickel metal layer formed on a side surface of the circuit pattern is thicker than that of the top surface of the circuit pattern. Thus, the nickel metal layer may be laterally spread.

When pumice is applied to the metal layer formed as described above, roughness is not effectively applied on the side surface of the circuit pattern, so that a glossiness difference is caused between the nickel metal layer formed on the top surface and the nickel metal layer formed on the side surface, so it is recognized as a test error.

Figure 14:
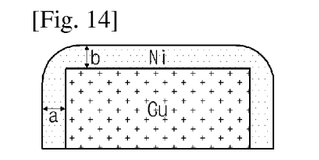
FIG. 14 is a view showing a metal layer of a printed circuit board according to an embodiment.

FIG. 14 is a view showing a nickel metal layer of a printed circuit board according to an embodiment.

The nickel plating layer is formed by using a nickel plating solution comprising a primary brightener and a secondary brightener according to the embodiment. The primary brightener is added into the nickel plating solution at a concentration in the range of 5 Ml/l to 7 Ml/l, and the second brightener is added into at a concentration in the range of 0.2 Ml/l to 0.4 Ml/l.

When the concentrations of the primary and secondary brighteners are increased in the range of satisfying the glossiness, it is difficult to manage the plating solution. Since the increases of the concentrations of the primary and secondary brighteners exert an influence on the glossiness and the wear resistance, the primary brightener is preferably added at a concentration in the range of 5 Ml/l to 7 Ml/l and the secondary brightener is added at a concentration in the range of 0.2 Ml/l to 0.4 Ml/l by taking the liquid stability into consideration.

The ratio of the primary brightener to the secondary brightener exerts an influence on the first thickness of the plating layer which is formed on the top surface of the under layer and the second thickness of the plating layer which is formed on the side surface of the under layer.

When the difference between the first and second thicknesses deviates from a predetermined value, the reliability of the printed circuit board may be lowered.

Thus, according to the embodiment, the ratio of the primary brightener to the secondary brightener is set to 20:1 for maintaining the ratio of the plating thicknesses defined as first thickness/second thickness at 1.07.

Referring to FIG. 14, the nickel metal layer 150 having the first and second thickness substantially equal to each other may be obtained by forming the nickel metal layer 150 by using the nickel plating solution into which the primary and secondary brighteners are added at the ratio describe above.

Although embodiments have been described with reference to a number of illustrative embodiments thereof, it should be understood by those skilled in the art that numerous other modifications and embodiments can be devised within the spirit and scope of the accompanying claims.

Therefore, the technical scope of the embodiments is not limited to the disclosure, but shall be limited as disclosed in the accompanying claims.

The invention claimed is:

1. A printed circuit board for a memory card, the printed circuit board comprising:
   an insulating layer;
   a mounting part on a first surface of the insulating layer, the mounting part being electrically connected to a memory device through a wire;
   a terminal part on a second surface of the insulating layer, the terminal part being electrically connected to an external electronic appliance;
   a first metal layer on the mounting part; and
   a second metal layer on the terminal part,
   wherein a bonding property, a glossiness and a wear resistance of the first metal layer are same as a bonding property, a glossiness and a wear resistance of the second metal layer,
   wherein each of the first metal layer and the second metal layer comprises:
   a nickel metal layer formed on the mounting part and formed of nickel;
   a palladium metal layer formed on the nickel metal layer and formed of palladium; and
   a gold metal layer formed on the palladium metal layer,
   wherein the gold metal layer has a thickness in a range of 0.1 μm to 0.2 μm,
   wherein the nickel metal layer has a glossiness of 1.8 or more,
   wherein the nickel metal layer includes:
   a first part disposed on top surfaces of the mounting part and the terminal part, and having a first thickness; and
   a second part disposed on side surface of the mounting part and the terminal part, and having a second thickness,
   wherein a ratio of the first thickness to the second thickness is lower than 1.07, and greater than 1.0
   wherein the gold metal layer comprises a gold alloy layer comprising gold and at least one of silver, copper, palladium, zinc, cobalt and an inorganic material, and
   wherein the palladium metal layer comprises a palladium alloy layer comprising palladium and at least one of cobalt, zinc and an inorganic material.

2. The printed circuit board of claim 1, wherein the nickel metal layer has a thickness in a range of 5 μm to 8 μm, and the palladium metal layer has a thickness in a range of in a range of 0.1 μm to 0.2 μm.

3. A memory card comprising:
   a printed circuit board comprising an insulating layer;
   a memory device mounted on a predetermined region of a first surface of the printed circuit board;
   a first pattern electrically connected to the memory device through a wire; and
   a second pattern formed on a second surface of the printed circuit board and electrically connected to an external electronic appliance;
   a first metal layer on the first pattern; and
   a second metal layer on the second pattern,
   wherein a bonding property, a glossiness and a wear resistance of the first metal layer are same as a bonding property, a glossiness and a wear resistance of the second metal layer,
   wherein each of the first metal layer and the second metal layer comprises:
   a nickel metal layer on the first pattern and the second pattern;
   a palladium metal layer formed on the nickel metal layer and formed of palladium; and
   a gold metal layer formed on the palladium metal layer,
   wherein the nickel metal layer has a thickness in a range of 5 μm to 8 μm,
   wherein the palladium metal layer has a thickness in a range of in a range of 0.1 μm to 0.2 μm,
   wherein the gold metal layer has a thickness in a range of 0.1 μm to 0.2 μm,
   wherein the nickel metal layer has a glossiness of 1.8 or more,
   wherein the nickel metal layer includes:
   a first part disposed on top surfaces of the first pattern and the second pattern, and having a first thickness; and
   a second part disposed on side surface of the first pattern and the second pattern, and having a second thickness,
   wherein a ratio of the first thickness to the second thickness is lower than 1.07, and greater than 1.0
   wherein the gold metal layer comprises a gold alloy layer comprising gold and at least one of silver, copper, palladium, zinc, cobalt and an inorganic material, and
   wherein the palladium metal layer comprises a palladium alloy layer comprising palladium and at least one of cobalt, zinc and an inorganic material.

* * * * *